United States Patent [19]

Wakasugi et al.

[11] Patent Number: 4,888,701
[45] Date of Patent: Dec. 19, 1989

[54] APPARATUS FOR MEASURING VECTOR VOLTAGE RATIO

[75] Inventors: Tomio Wakasugi, Hachioji; Hideshi Tanaka, Koganei, both of Japan

[73] Assignee: Hewlett Packard Company, Palo Alto, Calif.

[21] Appl. No.: 21,864

[22] Filed: Mar. 4, 1987

[30] Foreign Application Priority Data

Mar. 4, 1986 [JP] Japan .................................. 61-46983

[51] Int. Cl.⁴ ............................................. G01R 27/00
[52] U.S. Cl. .................................. 364/482; 324/57 R; 324/83 R; 324/83 Q
[58] Field of Search ............. 364/482, 483; 324/83 Q, 324/83 R, 57 R, 59, 60 R, 62

[56] References Cited

U.S. PATENT DOCUMENTS

| | | | |
|---|---|---|---|
| 4,181,949 | 1/1980 | Hall | 364/487 |
| 4,196,475 | 4/1980 | Hall | 364/482 |
| 4,283,675 | 8/1981 | Sparber | 324/57 R |
| 4,306,297 | 12/1981 | Sugihara et al. | 364/483 |
| 4,342,089 | 7/1982 | Hall | 364/481 |
| 4,409,543 | 10/1983 | Sugihara | 324/83 Q |
| 4,481,464 | 11/1984 | Noguchi et al. | 324/57 R |
| 4,654,585 | 3/1987 | Yagi | 324/83 Q |

Primary Examiner—Parshotam S. Lall
Assistant Examiner—V. N. Trans
Attorney, Agent, or Firm—Donald N. Timbie

[57] ABSTRACT

An apparatus is disclosed for providing the projections of signals supplied to two inputs on mutually perpendicular axises by applying a different combination of the signals respectively at said input terminals and quadrature phases of an AC wave to each of four phase detectors or by applying each combination in sequence to each phase detector. Means are provided for calculating impedances from the outputs of the phase detectors when the voltages applied to the inputs are respectively those appearing across an unknown impedance and a calibrated resistor that is in series with it, there being an AC voltage applied across the series circuit.

4 Claims, 4 Drawing Sheets

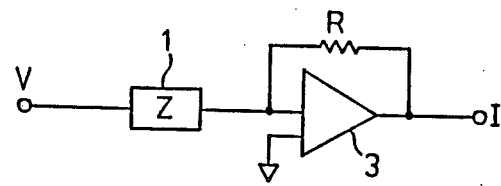
Figure 1
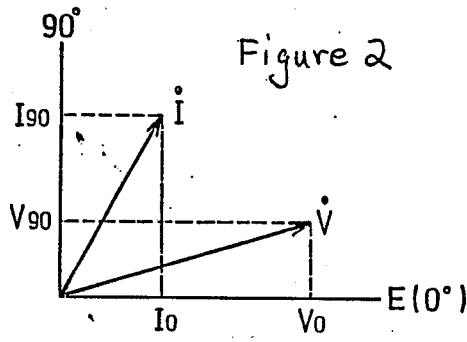
Figure 2
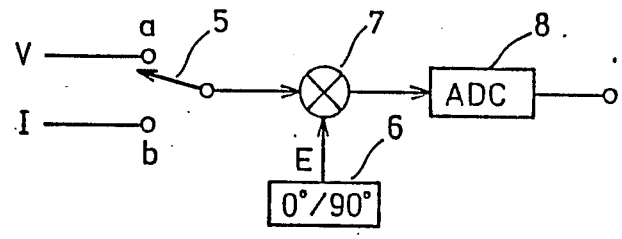
Figure 3
Figure 4
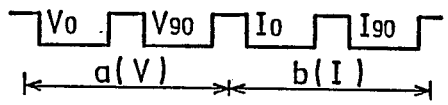

APPARATUS FOR MEASURING VECTOR VOLTAGE RATIO

BACKGROUND OF INVENTION

The present invention relates to an apparatus for measuring a vector voltage ratio, and more particularly, to an apparatus for measuring an amplitude ratio and a phasic difference of AC signals and determining the impedance of a sample element by obtaining a vector voltage ratio of two AC signals.

FIG. 1 is a circuit diagram showing a circuit for measuring impedance Z of a sample element 1. This circuit is arranged such that an input voltage V is impressed on the sample element 1, and an output voltage I is obtained from an operational amplifier 3 with a feedback resistor R. A vector voltage ratio is given by $I/V = R \cdot (1/Z)$, so that the impedance Z can be measured. V and I can, as shown in FIG. 2, be expressed with respect to a reference voltage E. Since the equation, $I/V = x + jy = (I_0 + jI_{90})/(V_0 + jV_{90})$, is established, x, y, and z can be obtained by measuring $I_0$, $I_{90}$, $V_0$, $V_{90}$ and performing necessary computation. Such a principle of measurement is described in the specification of U.S. Pat. No. 4,196,475.

There have heretofore been known two types of apparatuses for making such measurement, i.e., seeking $V_0$, $V_{90}$, $I_0$, $I_{90}$. FIG. 3 is a block diagram of the apparatus disclosed in the aforementioned specification of the above identified U.S. Patent. FIG. 4 is a diagram showing the order of measurement and the specified components, which are to be provided, of the two AC signals. The input voltage V and the output voltage I are applied via a switch 5 to one input terminal of a phase detector 7. To the other input terminal of the phase detector 7 are applied signals having a selected phase (0° or 90°) from a variable phase signal generator 6. Output signals of the phase detector 7 are digitized by an A/D converter (ADC) 8 (for instance, a dual slope type ADC) and are then outputted. As illustrated in FIG. 4, the switch is sequentially changed over to the contacts a and b, and at the same instant the phase of the variable phase signal generator 6 is selected, whereby $V_0$, $V_{90}$, $I_0$ and $I_{90}$ are consecutively obtained. That is, a serial type process is effected.

This apparatus employs the phase detector 7 and the ADC 8 in common with respect to the measurements of the above-described four values and then seeks the vector voltage ratio thereof. Consequently, the conversion factor (transfer characteristics) of the phase detector 7 or the like is cancelled, thereby making a highly accurate measurement possible. However, the measurements of the four values are consecutively and serially performed, which unfavorably results in a decrease in the rate of processing.

FIG. 5 is a block diagram of another conventional measuring apparatus. FIG. 6 is a diagram showing the specified components, which are to be provided, of the two AC signals. The difference between the apparatuses of FIGS. 3 and 5 is that in FIG. 5 the phase detectors 9 to 12 and ADCs 13 to 16 are separately utilized for measuring $V_0$, $V_{90}$, $I_0$, $I_{90}$ Therefore, $V_0$, $V_{90}$, $I_0$, $I_{90}$ are concurrently provided by the ADCs 13 to 16, thus carrying out a parallel type process.

Therefore, the apparatus of FIG. 5 is capable of performing a high speed measurement because of simultaneously measuring the four values. However, there are errors, such as errors caused by temperature changes in transfer characteristics of the circuit for measuring the four values causing errors in gain and indicated phase, thus contributing to errors in the accuracy of measurement.

Accordingly, it is a primary object of the present invention to obviate the above-described defects by providing an apparatus capable of selectively executing a serial type process and a parallel type process.

It is another object of the present invention to provide an apparatus which has advantages both of the serial type process and of the parallel type process.

It is another object of the present invention to provide an apparatus capable of performing a more accurate measurement than the conventional serial type process.

BRIEF DESCRIPTION OF THE DRAWINGS

FIG. 1 is a diagram showing an example of a circuit for measuring impedances Z.

FIG. 2 is a vector diagram of two AC signals.

FIG. 3 is a block diagram of a conventional apparatus for measuring a vector voltage ratio.

FIG. 4 shows the order of measurement and the specified components which are to be outputted, of two AC signals in the apparatus depicted in FIG. 3.

BRIEF SUMMARY OF THE INVENTION

An apparatus for measuring a vector voltage ratio according to the present invention comprises: a switch for selectively introducing two AC signals to four units of phase detectors; ADCs connected in series with the respective phase detectors; a variable phase signal generator for imparting phase signals selected in accordance with a measurement mode to the phase detectors; and a means for storing each of measured values and for effecting both computation and an averaging process. The parallel type process and the serial type process are carried out by controlling an operation to change over the switch and a phase of the phase signal. When a high speed measurement is required, the parallel type process is executed. On the other hand, if a highly accurate measurement is needed, the serial type process is performed.

DETAILED DESCRIPTION OF THE INVENTION

Figure 7:
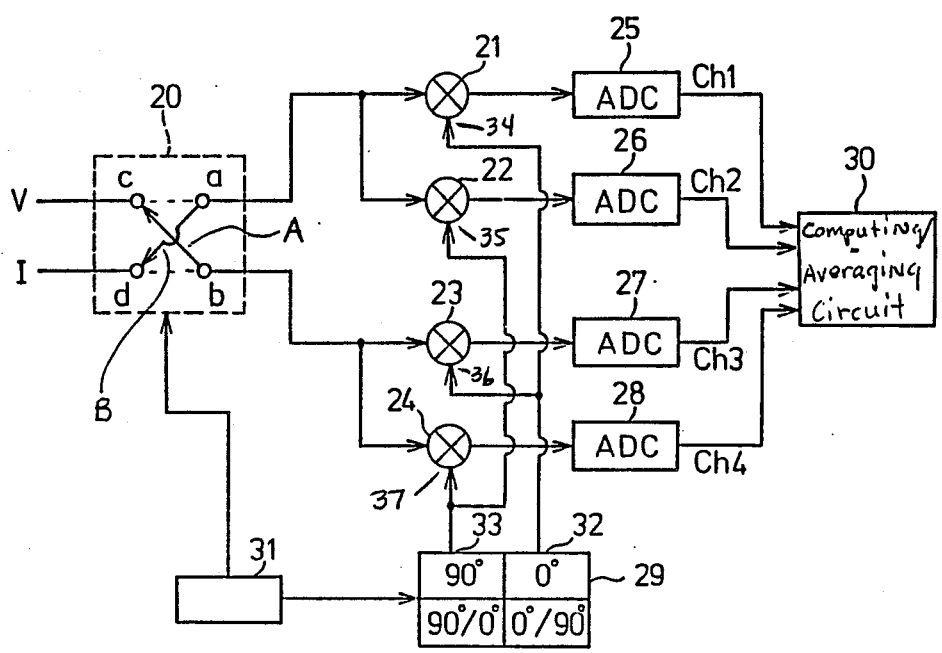
FIG. 7 is a block diagram of an apparatus for measuring a vector voltage ratio according to the present invention.

FIG. 7 is a block diagram of an apparatus for measuring a vector voltage ratio in one embodiment of the present invention. An AC signal V is applied to a contact point c of a switch 20, while an AC signal I is applied to another contact point d of the switch 20. A movable member B of the switch 20 is connected from one of the input terminals c or d to phase detectors 21, 22. A movable member A of the switch 20 is likewise connected from the other input terminal or to phase detectors 23, 24. The output terminals of the phase detectors 21 to 24 are respectively connected to the input terminals of A/D converters (ADC) 25 to 28. A variable phase signal generator 29 is provided having, for instance, a pair of output terminals 32, 33. One output terminal 32 is connected to the other input terminals 34 and 36 of the phase detectors 21, 23, and the other output terminal 33 is similarly connected to the other output terminals 35 and 37 of the phase detectors 22, 24. A control circuit 31 controls the change-over operation of the switch 20 and the phase of the output signals of a variable phase signal generator 29 in accordance with the measurement mode. The output signals of the ADCs 25 to 28 are transmitted to a computing/averaging circuit 30, which includes a storage circuit, such as a microprocessor, in which the desired computation and averaging operations are executed.

The apparatus of FIG. 1 functions as follows:

(1) High Speed Measurement Mode

Figures 5, 6:
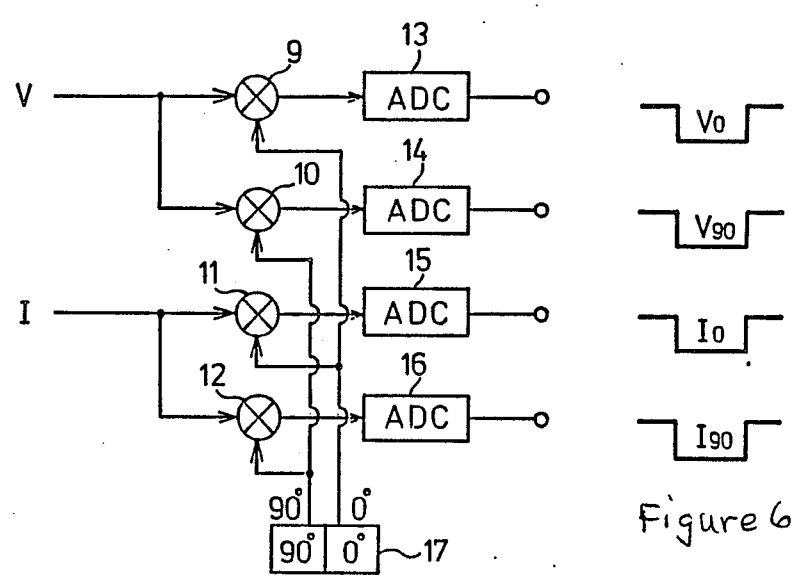
FIG. 5 is a block diagram of another conventional apparatus for measuring a vector voltage ratio.
FIG. 6 shows the specified components which are to be outputted, of two AC signals in the apparatus depicted in FIG. 5.
Figure 8:
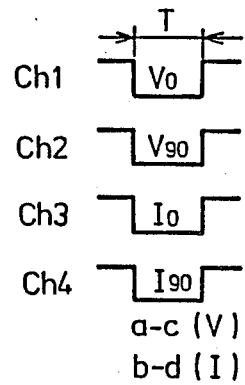
FIG. 8 shows the specified components which are to be outputted in a parallel type process, of two AC signals in the apparatus depicted in FIG. 7.

The description will be made with reference to FIGS. 7 and 8. FIG. 8 shows the specified components of two AC signals which components are to be provided by the apparatus depicted in FIG. 7. The switch 20 is so connected as to make a contact with c, and b contact with d. Signals having phase difference angles of 0° and 90° to a reference phase signal (for instance, E shown in FIG. 2) are transmitted to the output terminals 32, 33 of the variable phase signal generator 29. Hence, the AC signal V is supplied to the phase detectors 21 and 22, and similarly the AC signal I is supplied to the phase detectors 23 and 24, whereby $V_0$, $V_{90}$, $I_0$, $I_{90}$ can concurrently, as illustrated in FIG. 2, be sought from the ADCs 25 to 28 during a predetermined period T. The computing/averaging circuit 30 computes z, x and y on the basis of the aforementioned formula by employing the thus obtained four values. Incidentally, the high speed measurement mode needs no averaging operation. In this measurement mode, the constitution and the operations are the same as those of the conventional apparatus of FIG. 5: that is, the parallel type process is carried out, and the high speed measurement is performed. Therefore, when a high speed measurement is needed, this measurement mode is adopted.

(2) Highly Accurate Measurement Mode

Figure 9:
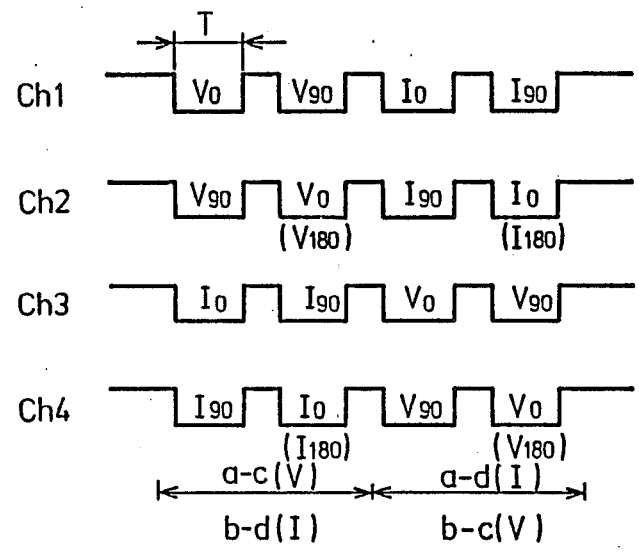
FIG. 9 shows the order of measurement and the specified components which are to be outputted in a serial-parallel type process, of the two AC signals in the apparatus depicted in FIG. 7.

The description relative to this mode will be made with reference to FIGS. 7 and 9. FIG. 9 shows the measurement order of the apparatus depicted in FIG. 7 and the specified components which are to be outputted, of the two AC signals. This measurement mode involves the serial-parallel type process. Initially, the switch 20 is connected so as to make a contact with c, and b contact with d. The signals having angles of 0° and 90° to the reference phase signal E are transmitted to the phase detectors 21, 22, 23 and 24 from the output terminals 32 and 33 of the variable phase signal generator 29. Consequently, $V_{90}$, $I_0$, $I_{90}$ can be obtained from outputs (channels $ch_1$ to $ch_4$) of the ADCs 25 to 28, and the thus obtained values are stored in the computing-/averaging circuit 30. Subsequently, the phase signals having angles 90°, 0° are transmitted to the phase detectors 21, 22, 23, and 24 from the output terminals 32, 33 of the variable phase signal generator 29 while keeping the previously set state of the switch 20. With this process, $V_{90}$, $V_0$, and $I_{90}$, $I_0$ can therefore be determined from the outputs of the ADCs 25 to 28. These values are also stored in the computing/averaging circuit 30. In the wake of this, the switch 20 is so changed over as to make a contact with d, and b contact with c. At the same time, the phase signals inclined both at 0° and at 90° are transmitted from the output terminals 32, 33. As a result, $I_0$, $I_{90}$, $V_0$, $V_{90}$ can be sought from the outputs of the ADCs 25 to 28, and the thus determined values are likewise stored in the computing/averaging circuit 30. Keeping the secondly set state of the switch 20, the phase signals having angles of 90°, 0° are transmitted from the output terminals 32, 33 and hence $I_{90}$, $I_0$, $V_{90}$, $V_0$ can be obtained from the outputs of the ADCs 25 to 28. Similarly, these four values are stored in the computing/averaging circuit 30. Eventually, impedances $Z_1$ to $Z_4$ are obtained for each channel with the aid of the computing/averaging circuit 30 by making use of the previously stored four values for each channel. Since the impedances Z are sought for every channel, a difference between the transfer characteristics of the respective channels does not contribute to a factor of error, which is the advantage of the serial type process. Thereafter, the computing/averaging circuit 30 seeks a mean value of the previously deduced four impedances Z, the mean value being given by $(Z_1+Z_2+Z_3+Z_4)/4$. Hence, the signal to noise ratio of the resulting measurement is improved, thereby realizing a measurement with higher accuracy.

It is to be noted that the change-over operation of the switch 20 and the phase change-over operation of the output signals of the variable phase signal generator 29 are not confined to the above-described order. The components of the four values per channel may be deduced in any order.

The phase of the output signal of the variable signal generator 29 is not limited to 0° and 90°. As shown in FIG. 9, $V_{90}$, $V_{180}$, $I_{90}$, $I_{180}$, or $I_{90}$, $I_{180}$, $V_{90}$, $V_{180}$ may also be obtained. As a matter of course, if the measurement is repeated eight times in order to seek $V_0$, $V_{90}$, $V_{180}$, $V_{270}$, $I_0$, $I_{90}$, $I_{180}$, $I_{270}$, it is be feasible to eliminate an offset voltage of each channel including a phase detector. However, this kind of operation to eliminate the offset voltage may be performed once at a necessary time. As in the case of Japanese Patent Laid-Open No. 28306/1985 (U.S. Application Ser. No. 634,907 filed on Oct. 27, 1985) that was previously applied for by the present Applicant, the phase of the output signal of the variable phase signal generator 29 may be shifted continuously by a predetermined shift phase angle.

The present invention thus yields the following effects. Since the serial type process and the parallel type process can be selected as occasion demands, when requiring a high speed measurement, the parallel type process may be used, while if high accuracy is required, the serial type process may be carried out.

In a serial-parallel type process, the transfer characteristics of the apparatus do not contribute to creation of an error, and the ratio of signal to noise is improved as compared with the conventional serial type process. The reason for this improvement is that the same component (for instance, $V_0$) is measured four times on the whole, and the averaging operation is performed. In other words, if the same ratio of signal to noise as that of the conventional serial type process is permissible, it is possible to reduce the time of measurement of each component by a factor of 4 (T/4) and hence an even higher speed measurement than that of the conventional serial type process can be accomplished.

What is claimed is:

1. An apparatus comprising:
   first and second input terminals;
   four phase detectors, each having two inputs and an output;
   a source of AC waves having quadrature phases; and
   first means for respectively coupling a different combination of one of said first and second input terminals and one of said quadrature phases of said AC waves to the respective inputs of said four phase detectors when in a first mode, and for successively coupling each of four combinations of one of said first and second input terminals and one of said quadrature phases of said AC waves to the inputs of each of said four phase detectors when in a second mode.

2. An apparatus as set forth in claim 1 further comprising second means coupled to the outputs of said phase detectors for calculating the value of an impedance when said first means is in said first mode.

3. An apparatus as set forth in claim 1 further comprising:
   second means coupled to the outputs of said phase detectors for calculating an impedance value for each of said combinations applied to each of said phase detectors when said first means is in said second mode;
   third means coupled to said second means for storing each impedance value; and
   fourth means coupled to said third means for deriving an average of the impedance values.

4. In apparatus for determining the resistive and reactive components of an impedance, the combination of
   first and second input terminals to which V and I A.C. waves are to be applied,
   first, second, third and fourth phase detectors, each having first and second inputs and output,
   switch means for connecting said first terminal to said first inputs of said first and second phase detectors and said second terminal to said first inputs of said third and fourth phase detectors when in one position and for connecting said first terminal to said first inputs of said third and fourth phase detectors and said second terminal to said first inputs and said first and second phase detectors when in another position,
   a source for supplying quadrature phases of A.C. waves having the same frequency as the V and I waves applied to said terminals at the respective outputs thereof, said source being controllable to interchange the phases supplied to its outputs,
   means for coupling one of said outputs of said source to said second inputs of said first and third phase detectors and for coupling the other output of said source to said second inputs of said second and fourth phase detectors,
   a computing and averaging circuit;
   analog to digital converters respectively coupled between the outputs of said phase detectors and said computing and averaging circuit,
   said computing circuit having means for calculating impedance in response to signals supplied to its from said analog to digital converters for one position of said switch means and for a given combination of quadrature phases of said A.C. waves at the outputs of said source, and
   a control circuit for maintaining said switch in said one position while changing the quadrature phases of the A.C. waves at the outputs of said source in sequence and for maintaining said switch in said another position while changing the quadrature phases of the A.C. waves at the outputs of said source in sequence, and said computing circuit being programmed to calculate the average of the impedances represented by the signals derived from signals produced at the outputs of said analog to digital converters for each position of said switch and each combination of quadrature phases at the outputs of said source.

* * * * *